US006693416B2

(12) United States Patent
Roth

(10) Patent No.: US 6,693,416 B2
(45) Date of Patent: Feb. 17, 2004

(54) METHOD AND DEVICE FOR MEASURING THE PHASE SHIFT BETWEEN A PERIODIC SIGNAL AND AN OUTPUT SIGNAL AT AN OUTPUT OF AN ELECTRONIC COMPONENT

(75) Inventor: Richard Roth, Unterhaching (DE)

(73) Assignee: Infineon Technologies AG, Munich (DE)

( * ) Notice: Subject to any disclaimer, the term of this patent is extended or adjusted under 35 U.S.C. 154(b) by 38 days.

(21) Appl. No.: 10/158,267

(22) Filed: May 30, 2002

(65) Prior Publication Data

US 2002/0180415 A1 Dec. 5, 2002

(30) Foreign Application Priority Data

May 30, 2001 (DE) .......................................... 101 26 298

(51) Int. Cl.[7] .............................................. H03D 13/00
(52) U.S. Cl. ....................................... 324/76.77; 327/3
(58) Field of Search ...................... 324/76.41, 76.52, 324/76.77, 76.83, 91; 327/231, 233, 234, 3, 10, 156, 141; 375/354, 371

(56) References Cited

U.S. PATENT DOCUMENTS 3,644,835 A * 2/1972 Thompson ...................... 327/3
5,252,865 A * 10/1993 Davenport et al. ............ 327/3
6,011,822 A * 1/2000 Dreyer ........................ 375/376

FOREIGN PATENT DOCUMENTS

DE 21 63 595 C2 12/1972
DE 42 32 139 A1 3/1994

* cited by examiner

Primary Examiner—N. Le
Assistant Examiner—Amy He
(74) Attorney, Agent, or Firm—Laurence A. Greenberg; Werner H. Stemer; Gregory L. Mayback

(57) ABSTRACT

A method and a device for measuring a phase shift between a periodic signal and an output signal at an output of an electronic component. A supply voltage potential is applied to a electronic component, whereby the periodic signal is applied to the output of the electronic component. The current through the supply voltage input is measured, whereby a magnitude of the current corresponds to a phase shift between the periodic signal and the output signal.

9 Claims, 2 Drawing Sheets

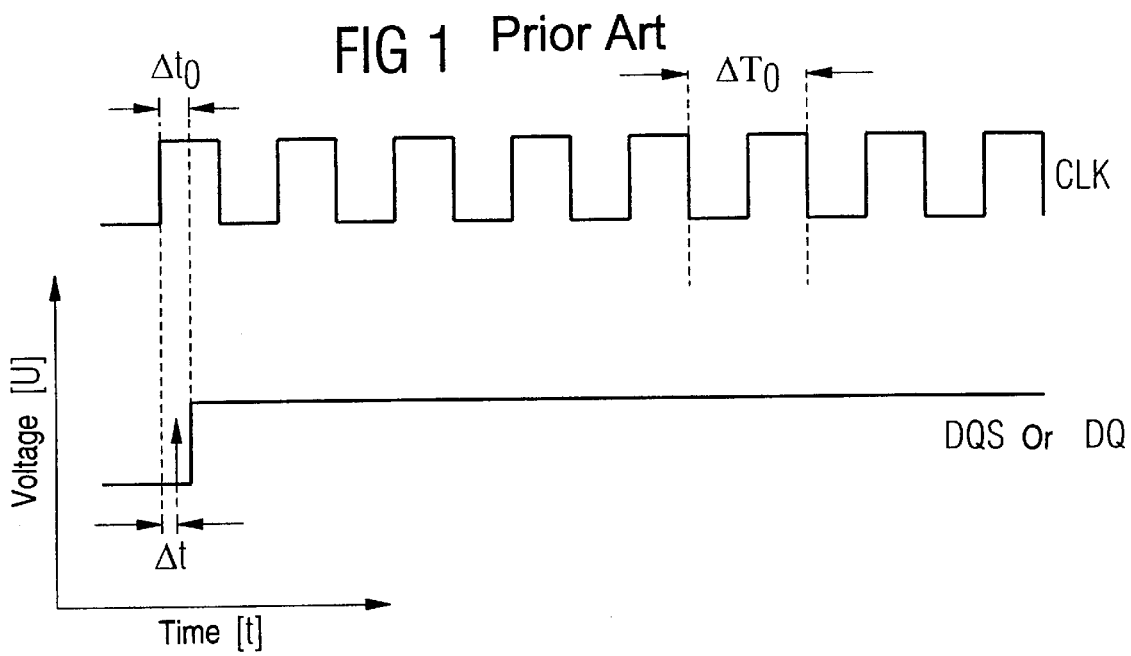
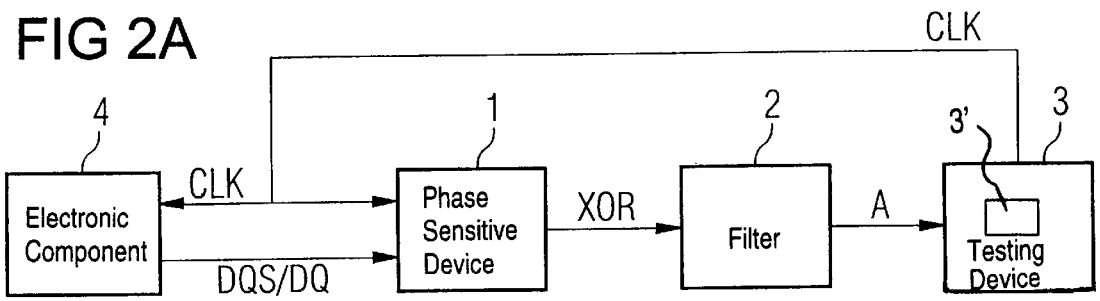
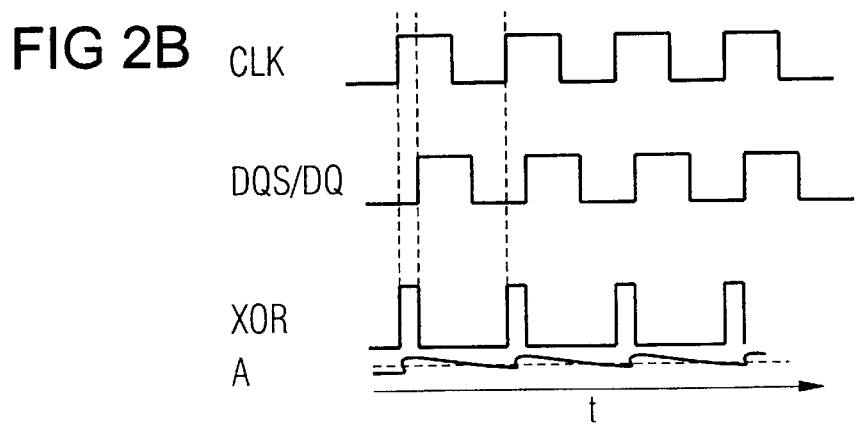

METHOD AND DEVICE FOR MEASURING THE PHASE SHIFT BETWEEN A PERIODIC SIGNAL AND AN OUTPUT SIGNAL AT AN OUTPUT OF AN ELECTRONIC COMPONENT

BACKGROUND OF THE INVENTION

Field of the Invention

The invention relates to the measuring of a phase shift between an external periodic signal that is applied to an electronic component, and an internal signal with which data are to be outputted at one or more outputs of an electronic component.

Electronic components are often synchronously driven; i.e., data are routed from one component to the next according to a clock signal. However, the importance of signal transit times and transit times of clock signals must not be overlooked, particularly for electronic components that are driven with high frequencies. In order to adapt the processing of data to the signal delays conditioned by the transit times, internal reference clock signals exhibiting a phase shift relative to the external clock signals are generated in the electronic components. The phase shift can derive from internal signal transit times in the electronic component and is strongly dependent on technology-related fluctuations.

In order to be able to correctly evaluate the output data in the testing of the electronic component, it is necessary to determine the phase shift between the external clock signal and the internal clock signal according to which the data are synchronously outputted by the electronic component.

In known testing systems, a time $\Delta t_0$ is customarily determined in order to measure the phase. $\Delta t_0$ is a time difference by which an evaluation signal of the testing device must be shifted relative to the clock signal of the testing device in order to correctly logically evaluate a data signal or an internal clock signal. The transition of the signal from "0" to "1" or vice versa is needed for this. In order to measure $\Delta t_0$, the evaluating signal of the testing device is varied until the transition between the two voltage levels of the signal has been found. The search process is time-intensive and must be performed for each data signal and the internal clock signal.

SUMMARY OF THE INVENTION

It is accordingly an object of the invention to provide a method and a device for measuring the phase shift between a periodic signal and an output signal at an output of an electronic component which overcome the above-mentioned disadvantages of the prior art methods and devices of this general type, in which the device provides an improved method with which the phase shift between the external clock signal and the internal clock signal (that is to say, the output data signal) in electronic components, particularly in the testing of the electronic component, can be determined.

With the foregoing and other objects in view there is provided, in accordance with the invention, a method for measuring phase shifts. The method includes providing an output driver having an output and a switching device connected to a supply voltage and to the output. An output signal is applied to the output driver. The supply voltage is switched through to the output in dependence upon the output signal. A periodic signal is applied to the output of the output driver. A current through the switching device is measured and a phase shift between the periodic signal and the output signal is determined in dependence on the current measured.

According to a first aspect of the invention, a phase-sensitive measuring element is utilized for measuring the phase shift between the periodic signal and the output signal. The phase-sensitive measuring element is configured to measure an electrical quantity representing an average value of the phase shift.

The advantage of utilizing a phase-sensitive measuring element is that the phase shift between the periodic signal and the output signal can be determined more exactly. In the prior methods, the phase shift is determined by timing, with the measured time being considered in relation to the period duration of the clock signal.

At very high clock signal frequencies, the timing is generally imprecise, because it is carried out by single measurements in discrete steps. The imprecision is determined mainly by the imprecision of the individual measurement steps and the size of the discrete steps. Another advantage is that the phase shift is automatically detected, and the value of the phase shift can be evaluated as an electrical quantity, for instance in the testing device, without unnecessarily prolonging the testing sequence by an expensive measuring sequence.

According to another aspect of the invention, a method is provided for measuring the phase shift between the periodic signal and the output signal at an output of an electronic component. The output signal is applied to an output driver. The output driver contains a switching device, which is connected to a supply voltage and the output, it being possible to switch the supply voltage through to the output in dependence upon the output signal. The periodic signal is applied to the output. The current through the switching device is measured, and the phase shift between the periodic signal and the output signal is calculated as a function of the measured current.

In accordance with an added mode of the invention, the current measured is averaged which gives a more reliable result.

In accordance with an addition mode of the invention, there are the steps of using an external clock signal as the periodic signal and using an internal clock signal for the output signal.

In another aspect of the invention, a device is provided for measuring the phase shift between the periodic signal and the output signal that can be applied at an output of an electronic component by an output driver. The output driver contains a switching device that is connected to a supply voltage terminal and to the output in order to switch the supply voltage terminal through to the output in dependence upon the output signal. The device contains a drive circuit for applying the periodic signal to the output of the electronic component. The device further contains a supply voltage source, which can be connected to the supply voltage terminal of the electronic component by way of a current measuring device. In this manner, the phase shift between the periodic signal and the output signal can be measured as in dependence on a current that is measured with the aid of the current measuring device.

The advantage of the invention is the possibility, in conventional testing devices, to measure the current flow into and out of the supply voltage inputs, on one hand, and to connect the terminals of the testing device to the electronic component in such a way that a signal can be driven to an output of the electronic component, on the other hand. This is possible because each connection to the testing device can be driven as an input and as an output under the control of the respective test program. In this manner, it is possible to determine the phase shift from the quantity of the current flowing into the supply voltage input.

In prior methods, the phase shift is performed by a timing operation, whereby the measured time is considered in relation to the period duration of the clock signal, and the phase shift is determined therefrom. In contrast, the present method has the advantage that it can be applied even given very high clock signal frequencies, i.e. given very small period durations. The timing operations become imprecise as the time differences to be measured become smaller, and therefore the phase shift can no longer be precisely measured. In contrast, the inventive method and device have the advantage that, the phase shift over several periods is automatically averaged, and the method is precise even given high frequencies and small phase shifts.

In a preferred embodiment, it is provided that a supply voltage input of the switching device is connected to a capacitance component, whereby an additional output of the capacitance component is connected to a fixed voltage potential. The capacitance component smoothes the current shape, thereby making it possible better to determine the average value of the phase shift.

In accordance with an added feature of the invention, a terminal for carrying a constant d.c. voltage potential is provided. A capacitance component having a first terminal is coupled to the supply voltage terminal and a second terminal is connected to the terminal carrying the constant d.c. voltage potential.

In accordance with another feature of the invention, a testing device is provided which contains the drive circuit.

In accordance with an additional feature of the invention, the supply voltage terminal is one of two supply voltage terminals each supplying a supply voltage, and the switching device is connected between the two supply voltage terminals.

In accordance with a further feature of the invention, the switching device has a transistor.

With the foregoing and other objects in view there is provided, in accordance with the invention, a method of measuring a phase shift. The method includes providing a phase-sensitive measuring element, and supplying the phase-sensitive measuring element with a periodic signal and an output signal. The output signal is provided at an output of an electronic component connected to the phase-sensitive measuring element. The phase-sensitive measuring element is used to measure an electrical quantity representing an average value of the phase shift between the periodic signal and the output signal.

In accordance with an added mode of the invention, there are the steps of measuring a voltage as the electrical quantity, and providing the phase-sensitive measuring element with a voltage measuring device for measuring the voltage.

In accordance with another mode of the invention, there is the step of providing the phase-sensitive measuring element with an exclusive-or gate with two inputs, the two inputs receiving the periodic signal and the output signal.

In accordance with a concomitant mode of the invention, there is the step of providing the phase-sensitive element with an analog phase detector containing a step recovery diode.

Other features which are considered as characteristic for the invention are set forth in the appended claims.

Although the invention is illustrated and described herein as embodied in a method and a device for measuring the phase shift between a periodic signal and an output signal at an output of an electronic component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a graph showing a method for determining a phase shift according to the prior art.

FIG. 2A is a block diagram of a first preferred embodiment for measuring the phase shift with an aid of a phase-sensitive element according to the invention;

FIG. 2B is a graph of a signal curve for input and output signals of the phase-sensitive element according to FIG. 2A.

DESCRIPTION OF THE PREFERRED EMBODIMENTS

Figure 3:
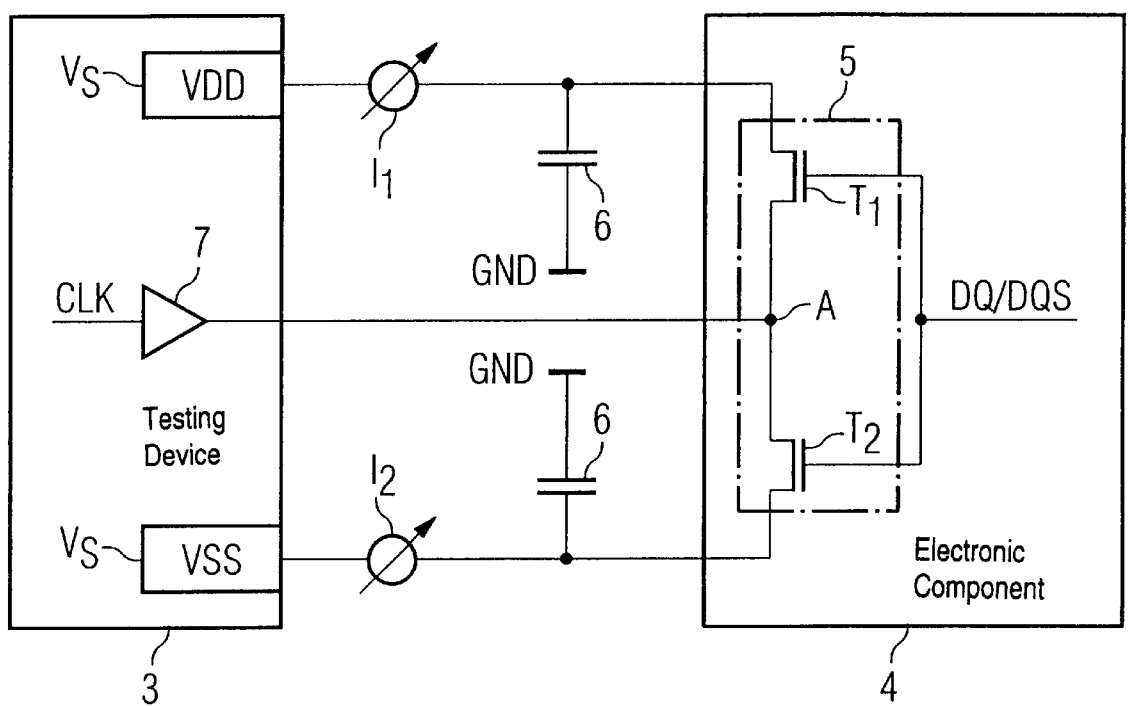
FIG. 3 is a circuit diagram of a second preferred embodiment for measuring the phase shift with the aid of a testing device.

Referring now to the figures of the drawing in detail and first, particularly, to FIG. 1 thereof, there is shown how a phase shift between an external clock signal and an internally generated clock signal (i.e. an internally generated item of data) is measured according to the prior art. In conventional testing methods, a testing device determines a time between a leading edge of the external clock signal and a subsequent leading edge of the internal clock signal or data signal.

The time is determined in that a sampling signal, with which the internal clock signal (data signal) is sampled, is generated with a variable time delay relative to the leading edge of the external clock signal. By varying the time delay $\Delta t$ of the sampling signal, it is possible to ascertain the delay with which the leading edge of the internal clock signal (data signal) follows the leading edge of the external clock signal. A phase shift $\phi$ is determined by considering the measured time difference $\Delta t_0$ in relation to the overall cycle length $\Delta T_0$ of the external clock signal. The phase shift $\phi$ is determined according to the following formula:

$$\phi(rad) = \frac{2 \cdot \pi \cdot \Delta t_0}{\Delta T_0}$$

In order to detect the corresponding edge of the internal clock signal (data signal), the signal is sampled multiple times in order to precisely determine the transition (i.e. the time difference $\Delta t_0$) of the signal from "0" to "1" or vice versa. The search process must be performed for each internal clock signal (data signal) and is therefore time-intensive.

FIG. 2A represents a block circuit diagram of a preferred embodiment of the invention. In a phase-sensitive element 1 an external clock signal CLK and an internal clock signal DQS (i.e. data signal DQ), which is outputted at an output of an electronic component 4, are associated with one another. The external clock signal CLK can be supplied by a testing device 3 and is fed to the component 4. At an output of the phase-sensitive element 1 is an output signal XOR, at which the phase shift between the external clock signal CLK and the internal clock signal DQS (data signal DQ) can be read.

In a possible embodiment, the phase-sensitive element 1 includes an exclusive-or gate at whose output impulses are outputted with the frequency of the clock signals (as represented in FIG. 2B), whereby a length of the impulses is determined by the phase shift of the signals to one another.

The output signal XOR of the phase-sensitive element 1 is filtered by a low-pass filter 2, so that a substantially constant analog output signal A is formed, which corresponds to a voltage level. The voltage level can then be measured in the testing device 3 and then represents a measure of the phase shift of the external clock signals CLK and the internal clock signals DQS (data signals DQ). In this manner, the average phase shift φ between the signals can be determined, with fluctuations between the phase shifts (jitter) being averaged out by the low-pass filter.

The voltage level can be measured by a voltage measuring device 3', which can be located in the testing device 3, for example. The phase-sensitive element 1 can be connected to the electronic component 4, though it can also be integrated into the electronic component 4. As phase-sensitive elements, it is also possible to utilize log-in amplifiers (available from Stanford Research Systems), an analog phase detector employing a step recovery diode, a digital phase detector, and so on.

FIG. 3 represents another preferred embodiment for measuring the phase shift φ between the external clock signal and the internal clock signal DQS (data signal DQ) of an integrated circuit. The integrated circuit can be constructed in the form of an SGRAM or DDR-SDRAM. The phase shift is performed with the testing device 3 (automated test equipment ATE). The testing device 3 is capable of supplying the integrated circuit 4 with voltage supplies $V_s$, whereby the current flowing through the voltage supplies $V_s$ can be measured with the aid of current measuring devices 11, 12 located in or downstream from the testing device 3.

The integrated circuit 4 contains an output drive circuit 5, which includes a first transistor T1 and a second transistor T2. A first terminal of the first transistor T1 is connected to a first supply voltage level $V_{DD}$ via the voltage supply $V_S$ of the testing device 3, and a second terminal of the first transistor T1 is connected to the signal output A. A first terminal of the second transistor T2 is connected to a second supply voltage level $V_{SS}$, and a second terminal of the second transistor T2 is connected to the signal output A. The first and second transistors T1 and T2, respectively, are of different conductivity types. The digital internal clock signal DQS (i.e. data signal DQ) is supplied to control inputs of the first and second transistors T1 and T2 has the effect that either the first transistor T1 or the second transistor T2 becomes conductive, as a result of which either the first supply voltage level $V_{DD}$ or the second supply voltage level $V_{SS}$ is applied to the signal output A.

The testing device 3 is so connected to the integrated circuit 4 by way of a drive circuit 7, that the external clock signal CLK is driven to the signal output A of the integrated circuit 4. In this manner, the external clock signal CLK and the internal clock signal DQS (data signal DQ) at the control inputs of the first and second transistors T1 and T2 are driven against one another.

When the external clock signal CLK and the internal clock signal DQS (data signal DQ) at the control inputs of the first and second transistors T1 and T2 are in phase, the transistors T1, T2 simultaneously switch at that instant when the signal driven onto the signal output A by the testing device 3 changes from high to low level or vice versa. As a result, an identical voltage potential is present at the two terminals of the respective first or second transistor T1 and T2 when the transistor is conductive. A current measuring operation at the respective supply voltage input then shows no substantial current flow through the transistor T1 or the transistor T2.

If the external clock signal CLK and the internal clock signal DQS or data signal DQ are phase-shifted relative to one another, the full voltage swing is present across the respective transistor for the period between the corresponding clock edges, and the transistor is then switched to conduct. In this way, a current flows across the respective transistor T1, T2 for a period corresponding to the time quantity of the phase shift φ. Thus calculated, the phase shift φ can be utilized in the testing device 3 to set signal delay elements so that a phase shift φ between signals can be compensated.

In order to evaluate the periodically pulsed current flow, capacitors 6 are provided at the supply voltage terminals of the integrated circuit 4, which smooth the voltage shape and thus the current shape. The capacitors 6 are parallel to the supply voltage terminal and a ground potential GND. As a result, a nearly constant current flows, whose magnitude is dependent upon the magnitude of the phase shift. The capacitors 6 for buffering the supply voltages are typically provided inside the chip in the form of a chip surface region that is constructed as a capacitor or even by the capacity of the supply voltage lines. The supply voltage potentials $V_{DD}$, $V_{SS}$ that are provided by the testing device 3 may also be buffered by a capacitance.

The inventive features disclosed in the foregoing description and in the claims and drawings can, either individually or in any combination, be essential to the invention in its various embodiments.

I claim:

1. A method for measuring phase shifts, which comprises the steps of:

providing an output driver having an output and a switching device connected to a supply voltage and to the output;

applying an output signal to the output driver, the supply voltage being switched through to the output in dependence upon the output signal;

applying a periodic signal to the output of the output driver;

measuring a current through the switching device; and determining a phase shift between the periodic signal and the output signal in dependence on the current measured.

2. The method according to claim 1, which comprises averaging the current measured.

3. The method according to claim 1, which comprises using an external clock signal as the periodic signal.

4. The method according to claim 1, which comprises using an internal clock signal for the output signal.

5. A device for measuring phase shifts, the device comprising:

a supply voltage terminal for supplying a supply voltage source;

a component containing an output driver having a switching device coupled to said supply voltage terminal, said output driver having an output functioning as an output of said component, said output driver switching the supply voltage source through to said output in dependence upon an output signal applied to said output driver;

a drive circuit connected to said output and applying a periodic signal to said output;

a current measuring device connected between said supply voltage terminal and said switching device for supplying the supply voltage source to said switching device, a phase shift between the periodic signal and the output signal being measurable as a function of a current measured with an aid of said current measuring device.

6. The device according to claim 5, further comprising:

a terminal for carrying a constant d.c. voltage potential; and a capacitance component having a first terminal coupled to said supply voltage terminal and a second terminal connected to said terminal carrying the constant d.c. voltage potential.

7. The device according to claim 5, further comprising a testing device containing said drive circuit.

8. The device according to claim 5, wherein said supply voltage terminal is one of two supply voltage terminals each supplying a supply voltage, and said switching device connected between said two supply voltage terminals.

9. The device according to claim 5, wherein said switching device has a transistor.

* * * * *